(12) United States Patent
Li et al.

(10) Patent No.: US 11,978,498 B2
(45) Date of Patent: May 7, 2024

(54) METHOD AND APPARATUS FOR TESTING ADJUSTMENT CIRCUIT

(71) Applicant: CHANGXIN MEMORY TECHNOLOGIES, INC., Hefei (CN)

(72) Inventors: Yu Li, Hefei (CN); Teng Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 140 days.

(21) Appl. No.: 17/805,989

(22) Filed: Jun. 8, 2022

(65) Prior Publication Data
US 2023/0317137 A1    Oct. 5, 2023

(30) Foreign Application Priority Data

Mar. 29, 2022   (CN) .......................... 202210320875.4

(51) Int. Cl.
*H03K 5/05*       (2006.01)
*G11C 11/4076*    (2006.01)
*G11C 29/02*      (2006.01)

(52) U.S. Cl.
CPC ........ *G11C 11/4076* (2013.01); *G11C 29/023* (2013.01); *H03K 5/05* (2013.01)

(58) Field of Classification Search
CPC . G11C 11/4076; G11C 29/023; G11C 29/028; H03K 3/017; H03K 5/04; H03K 5/05; H03K 5/1565; H03K 7/08
See application file for complete search history.

(56) References Cited

U.S. PATENT DOCUMENTS

| 10,600,459 | B2 | 3/2020 | Kim |
| 2019/0237127 | A1* | 8/2019 | Moon .................... G11C 7/222 |

FOREIGN PATENT DOCUMENTS

CN    112204664 A    1/2021

* cited by examiner

*Primary Examiner* — Jung Kim
(74) *Attorney, Agent, or Firm* — Cooper Legal Group, LLC

(57) ABSTRACT

A method and an apparatus for testing an adjustment circuit is applied to a test platform. The adjustment circuit includes a duty cycle adjuster (DCA) circuit. The method includes: receiving written data at a specified storage address based on a first read/write clock signal; and receiving read data from the specified storage address based on a second read/write clock signal, and generating a test result of the DCA circuit based on the written data and the read data; wherein the DCA circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

17 Claims, 6 Drawing Sheets

METHOD AND APPARATUS FOR TESTING ADJUSTMENT CIRCUIT

CROSS-REFERENCE TO RELATED APPLICATIONS

This application claims the priority of Chinese Patent Application No. 202210320875.4, submitted to the Chinese Intellectual Property Office on Mar. 29, 2022, the disclosure of which is incorporated herein in its entirety by reference.

TECHNICAL FIELD

Embodiments of the present disclosure relate to the technical field of semiconductors, and in particular, to a method and an apparatus for testing an adjustment circuit.

BACKGROUND

In the semiconductor industry, a read/write clock signal of a memory chip such as a dynamic random access memory (DRAM) is generally provided by an external control chip. A duty cycle deviation may occur when the read/write clock signal is generated, transmitted, and processed by the DRAM.

In the related art, a duty cycle adjuster (DCA) circuit is proposed to correct the duty cycle deviation of the read/write clock signal.

However, a deviation correction amplitude of the DCA circuit is relatively small, generally only a dozen of picoseconds, and minimum holding time of one piece of data on a data bus is hundreds of picoseconds. Therefore, it is difficult to directly observe whether the DCA circuit is in a valid state in most cases.

SUMMARY

Embodiments of the present disclosure provide a method and an apparatus for testing an adjustment circuit.

According to a first aspect, an embodiment of the present disclosure provides a method for testing an adjustment circuit, applied to a test platform, wherein the adjustment circuit includes a duty cycle adjuster circuit, the test platform is electrically connected to the adjustment circuit, and the method includes:

receiving written data at a specified storage address based on a first read/write clock signal; and receiving read data from the specified storage address based on a second read/write clock signal, and generating a test result of the duty cycle adjuster circuit based on the written data and the read data; wherein the duty cycle adjuster circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

According to a second aspect, an embodiment of the present disclosure provides an apparatus for testing an adjustment circuit, applied to a test platform, wherein the adjustment circuit includes a duty cycle adjuster circuit, the test platform is electrically connected to the adjustment circuit, and the apparatus includes:

at least one processor and a memory, wherein the memory stores a computer executable instruction; and the at least one processor executes the computer executable instruction stored in the memory, such that the at least one processor performs:

receiving written data at a specified storage address based on a first read/write clock signal;

receiving read data from the specified storage address based on a second read/write clock signal; and generating a test result of the duty cycle adjuster circuit based on the written data and the read data; wherein the duty cycle adjuster circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

According to a third aspect, an embodiment of the present disclosure provides a computer-readable storage medium, storing a computer executable instruction, when executing the computer executable instruction, a processor implements the method for testing an adjustment circuit in the first aspect.

BRIEF DESCRIPTIONS OF THE DRAWINGS

DETAILED DESCRIPTION

Figure 1:
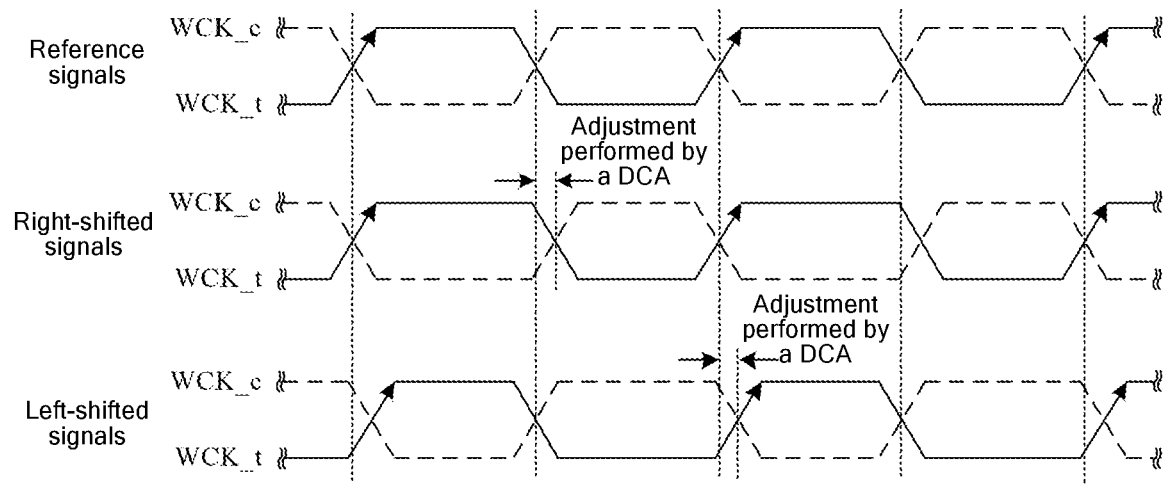
FIG. 1 is a schematic diagram of a clock signal adjustment process according to an embodiment of the present disclosure.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those of ordinary skill in the art based on the embodiments of the present disclosure without creative efforts should fall within the protection scope of the present disclosure. In addition, although disclosures in the present disclosure are presented according to one or several exemplary examples, it should be understood that each aspect of these disclosures can also individually constitute a complete implementation.

It should be noted that brief descriptions of the terms in the present disclosure are used only to facilitate the understanding of the implementations described below, and are not intended to limit the implementations of the present disclosure. Unless otherwise stated, these terms should be understood according to their ordinary and usual meanings.

In the specification, claims, and accompanying drawings of the present disclosure, the terms "first", "second", and so on are intended to distinguish similar or like objects or entities but do not necessarily indicate a specific order or sequence, unless otherwise noted. It should be understood that the terms used in such a way are interchangeable in proper circumstances, for example, can enable implementation in other sequences than those illustrated or described in the embodiments of the present disclosure.

In addition, the terms "including" and "having" and any variations thereof are intended to cover non-exclusive inclusion. For example, for products or devices that include a series of components, the components are not necessarily limited to those clearly listed, but may include other components not clearly listed or inherent to these products or devices.

The term "module" as used in the present disclosure refers to any known or later developed hardware, software, firmware, artificial intelligence, fuzzy logic or combination of hardware or/and software code that can perform the functions associated with the component.

The present disclosure relates to a semiconductor integrated circuit, and in particular, to a memory chip, which can be used to detect whether a DCA circuit in the memory chip is in an ideal working state.

Typically, a memory system includes a controller and a memory. In some embodiments of the present disclosure, the memory may be a DRAM, for example, a low power double data rate (LPDDR) DRAM. The controller and the memory communicate with each other through a plurality of buses. For example, the memory receives a command and an address on a command/address bus, and data is provided between the controller and the memory through a data bus.

In addition, various clock signals can be provided between the controller and the memory through a clock bus. When a clock signal is periodically switched between a low clock level and a high clock level, the clock signal is active. On the contrary, when a clock signal maintains at a constant clock level and is not switched periodically, the clock signal is inactive.

The clock bus may include a signal line for providing system clock signals CK_t and CK_c received by the memory, data clock signals WCK_t and WCK_c received by the memory, and access data clock signals RDQS_t and RDQS_c provided by the memory to the controller.

For a write command, when the memory is ready to receive written data from the controller, the controller provides the clock signals WCK_t and WCK_c to the memory. The clock signals WCK_t and WCK_c can be used by the memory to generate an internal clock signal to perform timekeeping on an operation of receiving the written data by a circuit. Data is provided by the controller, and the memory receives the written data based on the clock signals WCK_t and WCK_c. The written data is written into a memory corresponding to a memory address.

For a read command, when the memory is ready to provide read data to the controller, the controller provides the clock signals WCK_t and WCK_c to the memory. The clock signals WCK_t and WCK_c can be used by the memory to generate the access data clock signals RDQS_t and RDQS_c. The memory performing a read operation provides the access data clock signals RDQS_t and RDQS_c to the controller to perform timekeeping on an operation of providing the read data to the controller. The controller can use the access data clock signals RDQS_t and RDQS_c to receive the read data.

The clock signal has a duty cycle, and the duty cycle is a valid fraction of a signal in one cycle of a binary periodic signal. For example, the clock signal may alternate between a logic high level (for example, a high voltage level) and a logic low level (for example, a low voltage level). A semiconductor device can adjust the duty cycle of the clock signal to ensure that the clock signal matches a desired duty cycle (for example, 50%).

A read/write clock signal WCK of the DRAM is generally provided by an external controller. A duty cycle deviation may occur when the read/write clock signal is generated, transmitted, and processed by the DRAM. In order to correct the duty cycle deviation of the read/write clock signal in the DRAM, a DCA circuit is proposed in the prior art. When a duty cycle of the read/write clock signal deviates, the duty cycle of the read/write clock signal can be adjusted, so as to maintain the duty cycle of the read/write clock signal at 50% as far as possible.

A mode register of the DCA circuit can set different gears based on a degree of the duty cycle deviation to realize internal deviation correction. In addition, the mode register needs to set different gears based on a degree of a leftward or rightward deviation of the duty cycle of the clock signal to realize internal deviation correction.

In some embodiments, the DCA circuit can adjust the duty cycle for one or more read/write clock signals based on a value of a duty cycle code stored in a register of the mode register.

For better understanding of the embodiments of the present disclosure, refer to FIG. 1. FIG. 1 is a schematic diagram of a clock signal adjustment process according to an embodiment of the present disclosure.

In FIG. 1, reference signals include initial clock signals WCK_c and WCK_t, right-shifted signals are signals obtained by shifting the initial clock signals WCK_c and WCK_t right by the DCA circuit, and left-shifted signals are signals obtained by shifting the initial clock signals WCK_c and WCK_t left by the DCA circuit.

The clock signals WCK_t and WCK_c are complementary, that is, a rising edge of WCK_t and a falling edge of WCK_c occur simultaneously, and a rising edge of WCK_c and a falling edge of WCK_t occur simultaneously.

However, a deviation correction amplitude of the DCA circuit is relatively small, generally only a dozen of picoseconds according to a protocol, and minimum holding time of one piece of data on the data bus is hundreds of picoseconds. Therefore, it is difficult to directly observe whether the DCA circuit is in a valid state in most cases.

To resolve the foregoing technical problem, the embodiments of the present disclosure provide a method for testing an adjustment circuit. The method for testing an adjustment circuit can be applied to a test platform, and the adjustment circuit includes a DCA circuit. The test platform provides an initial read/write clock signal with a duty cycle deviation. After the initial read/write clock signal is adjusted by the DCA circuit, write and read operations are performed at a specified storage address based on an adjusted read/write clock signal, and then whether the DCA circuit is valid can be accurately determined based on written data and read data. The following provides description by using detailed embodiments.

Figure 2:
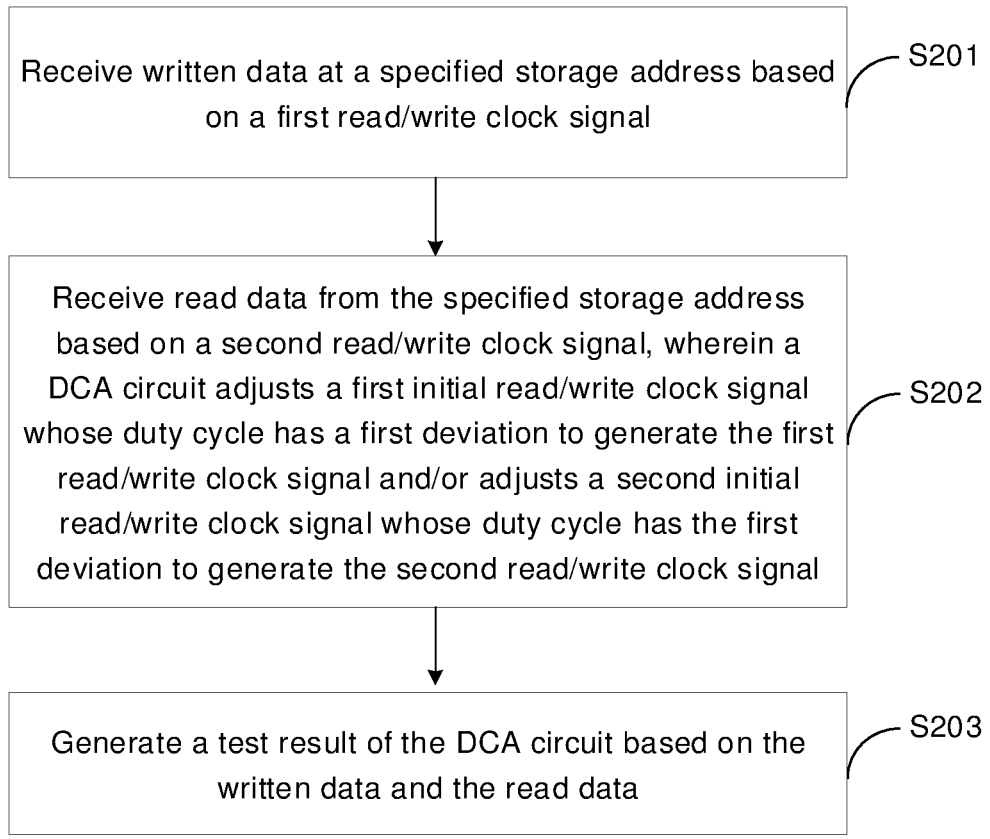
FIG. 2 is a schematic flowchart of steps of a method for testing an adjustment circuit according to an embodiment of the present disclosure.

Referring to FIG. 2, FIG. 2 is a schematic flowchart of steps of a method for testing an adjustment circuit according to an embodiment of the present disclosure. In a feasible implementation, the method for testing an adjustment circuit is applied to a test platform, the adjustment circuit includes a DCA circuit, the test platform is electrically connected to the adjustment circuit, and the method for testing an adjustment circuit includes the following steps.

S201: Receive written data at a specified storage address based on a first read/write clock signal.

In some embodiments, in a test process, the test platform is connected to a to-be-tested chip, and test personnel can test the DCA circuit in the to-be-tested chip by starting a preset test program in the test platform or inputting a preset test instruction to the test platform.

In some embodiments, after receiving an address signal and a write command signal, the test platform can receive the written data at a storage address specified by the address signal.

Optionally, the written data may be binary data with a fixed format.

S202: Receive read data from the specified storage address based on a second read/write clock signal.

The DCA circuit is configured to adjust a first initial read/write clock signal whose duty cycle has a first deviation to generate the first read/write clock signal and/or adjust a second initial read/write clock signal whose duty cycle has the first deviation to generate the second read/write clock signal.

Optionally, in a feasible implementation, the test platform may directly provide the first initial read/write clock signal whose duty cycle has the first deviation and/or the second initial read/write clock signal whose duty cycle has the first deviation.

In another feasible implementation, the test platform may alternatively provide a standard read/write clock signal whose duty cycle is 50%. By delaying the standard read/write clock signal, the test platform can output the first initial read/write clock signal whose duty cycle has the first deviation and/or the second initial read/write clock signal whose duty cycle has the first deviation.

It should be understood that the term "and/or" in this specification merely describes an association relationship between associated objects, and indicates that three types of relationships may exist. For example, A and/or B may indicate that A exists alone, A and B coexist, or B exists alone. In addition, the character "/" in this specification generally indicates that the associated objects are in an "or" relationship.

In some embodiments, the test platform may input the first initial read/write clock signal with the first deviation and/or the second initial read/write clock signal with the first deviation to the DCA circuit, and the DCA circuit adjusts the first initial read/write clock signal to generate the first read/write clock signal and/or adjusts the second initial read/write clock signal to generate the second read/write clock signal.

The DCA circuit performs deviation correction on the first initial read/write clock signal based on a degree of a leftward or rightward deviation of the duty cycle of the first initial read/write clock signal and/or on the second initial read/write clock signal based on a degree of a leftward or rightward deviation of the duty cycle of the second initial read/write clock signal, such that the duty cycle of the first initial read/write clock signal and the duty cycle of the second initial read/write clock signal are 50%.

In some embodiments, the DCA circuit supports a plurality of adjustment gears, and different adjustment gears correspond to different adjustment amplitudes.

In some embodiments, the DCA circuit may include an adjustment range of 15 steps from +7 to −7. In this way, the DCA circuit can be set to any one of the 15 different steps within the adjustment range of the DCA circuit to adjust the duty cycle of the first initial read/write clock signal and/or the duty cycle of the second initial read/write clock signal. A difference between an actual value of step N and an actual value of step N+1 (or N−1) may not be linear. The DCA circuit shifts a read/write clock signal WCK right by increasing (+) a step and shifts the read/write clock signal WCK left by reducing (−) a step.

For example, it is assumed that the DCA circuit can support seven adjustment gears, namely "gear −3", "gear −2", "gear −1", "gear 0", "gear 1", "gear 2", and "gear 3". In the above seven gears, "gear −3" corresponds to leftward adjustment by a picoseconds, "gear −2" corresponds to leftward adjustment by b picoseconds, "gear −1" corresponds to leftward adjustment by c picoseconds, "gear 0" means keeping a sampling clock signal unchanged, "gear 3" corresponds to rightward adjustment by a picoseconds, "gear 2" corresponds to rightward adjustment by b picoseconds, and "gear 1" corresponds to rightward adjustment by c picoseconds. a, b, and c are positive numbers, and a>b>c.

In some embodiments, the DCA circuit can perform deviation correction and adjustment on the first initial read/write clock signal by selecting a corresponding adjustment gear based on the degree of the leftward or rightward deviation of the duty cycle of the first initial read/write clock signal and/or on the second initial read/write clock signal by selecting a corresponding adjustment gear based on the degree of the leftward or rightward deviation of the duty cycle of the second initial read/write clock signal.

S203: Generate a test result of the DCA circuit based on the written data and the read data.

It can be understood that if the DCA circuit is in a valid state, the written data received by the test platform at the specified storage address based on an adjusted first read/write clock signal is consistent with data that the test platform wants to write, and the read data received by the test platform from the specified storage address based on an adjusted second read/write clock signal is also consistent with the written data stored in the specified storage address.

If the DCA circuit is in an invalid state, the duty cycle of the first initial read/write clock signal and/or the duty cycle of the second initial read/write clock signal cannot be adjusted to 50%. In this case, a duty cycle of the first read/write clock signal and/or a duty cycle of the second read/write clock signal have/has a deviation. Therefore, the written data received by the test platform at the specified storage address based on the adjusted first read/write clock signal is inconsistent with the data that the test platform wants to write, and/or the read data received by the test platform from the specified storage address based on the adjusted second read/write clock signal is inconsistent with the written data stored in the specified storage address.

Therefore, in some embodiments, the test platform can compare the written data and the read data to determine whether the DCA circuit is in the valid state, and then generate the test result of the DCA circuit based on a determining result.

According to the method for testing an adjustment circuit in this embodiment of the present disclosure, the test platform provides an initial read/write clock signal with a duty cycle deviation. After the initial read/write clock signal is adjusted by the DCA circuit, write and read operations are performed at a specified storage address based on an adjusted read/write clock signal, and then whether the DCA circuit is valid can be accurately determined based on written data and read data.

Figure 3:
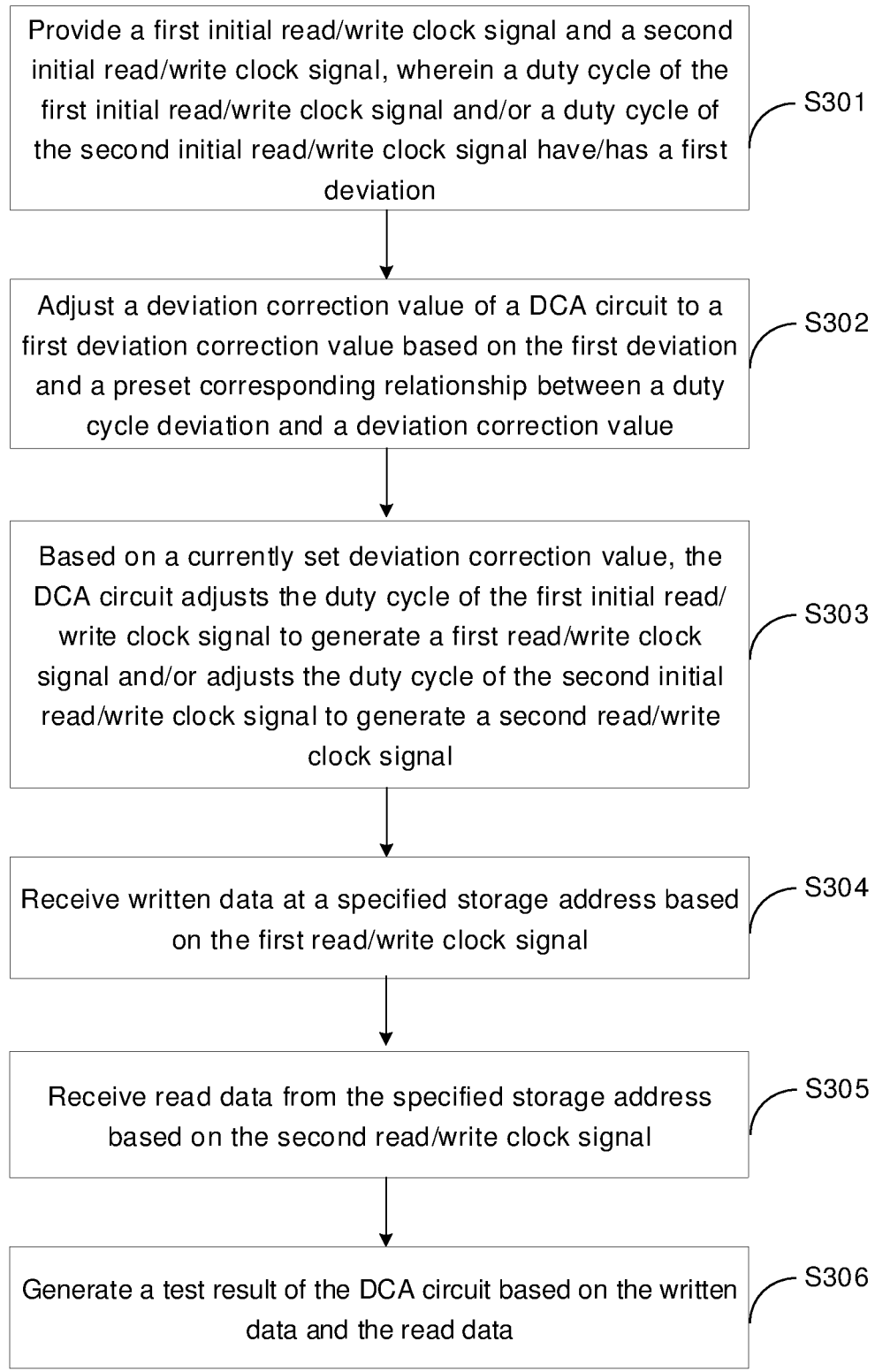
FIG. 3 is a schematic flowchart of steps of another method for testing an adjustment circuit according to an embodiment of the present disclosure.

Based on the content described in the above embodiment, referring to FIG. 3, FIG. 3 is a schematic flowchart of steps of another method for testing an adjustment circuit according to an embodiment of the present disclosure. In a feasible implementation, the method for testing an adjustment circuit is applied to a test platform, the adjustment circuit includes a DCA circuit, the test platform is electrically connected to the adjustment circuit, and the method for testing an adjustment circuit includes the following steps.

S301: Provide a first initial read/write clock signal and a second initial read/write clock signal, where a duty cycle of the first initial read/write clock signal and/or a duty cycle of the second initial read/write clock signal have/has a first deviation.

Optionally, the test platform may directly provide the first initial read/write clock signal whose duty cycle has the first deviation and/or the second initial read/write clock signal whose duty cycle has the first deviation. Alternatively, the test platform may provide a standard read/write clock signal whose duty cycle is 50%. By delaying the standard read/write clock signal, the test platform can output the first initial read/write clock signal whose duty cycle has the first deviation and/or the second initial read/write clock signal whose duty cycle has the first deviation.

In some embodiments, the initial read/write clock signal provided by the test platform includes the following four cases:

1. The duty cycle of the first initial read/write clock signal has the first deviation, and the duty cycle of the second initial read/write clock signal is 50%.
2. The duty cycle of the second initial read/write clock signal has the first deviation, and the duty cycle of the first initial read/write clock signal is 50%.
3. Both the duty cycle of the first initial read/write clock signal and the duty cycle of the second initial read/write clock signal have the first deviation.
4. Both the duty cycle of the first initial read/write clock signal and the duty cycle of the second initial read/write clock signal are 50%.

In some embodiments, the above four cases can be selected by a control module. For example, when a status of the control module is 00, the third case is selected; when the status of the control module is 01, the first case is selected; when the status of the control module is 10, the second case is selected; and when the status of the control module is 11, the fourth case is selected.

S302: Adjust a deviation correction value of the DCA circuit to a first deviation correction value based on the first deviation and a preset corresponding relationship between a duty cycle deviation and a deviation correction value.

In some embodiments, the duty cycle deviation and the deviation correction value may have a same value but opposite directions. For example, when the first deviation is a leftward deviation of N picoseconds, the deviation correction value should be a rightward deviation of N picoseconds, where N is not 0.

In some embodiments, different duty cycle deviations may correspond to different deviation correction gears. A deviation correction gear of the DCA circuit can be adjusted based on the first deviation.

For example, it is assumed that the DCA circuit can support seven adjustment gears, namely "gear −3", "gear −2", "gear −1", "gear 0", "gear 1", "gear 2", and "gear 3". In the above seven gears, "gear −3" corresponds to leftward adjustment by a picoseconds, "gear −2" corresponds to leftward adjustment by b picoseconds, "gear −1" corresponds to leftward adjustment by c picoseconds, "gear 0" means keeping a sampling clock signal unchanged, "gear 3" corresponds to rightward adjustment by a picoseconds, "gear 2" corresponds to rightward adjustment by b picoseconds, and "gear 1" corresponds to rightward adjustment by c picoseconds. a, b, and c are positive numbers, and a>b>c. When the first deviation is the leftward deviation of N picoseconds, if N≤a, it is determined that the deviation correction gear of the DCA circuit is "gear −3"; if a>N≤b, it is determined that the deviation correction gear of the DCA circuit is "gear −2", and so on.

S303: Based on a currently set deviation correction value, the DCA circuit adjusts the duty cycle of the first initial read/write clock signal to generate a first read/write clock signal and/or adjusts the duty cycle of the second initial read/write clock signal to generate a second read/write clock signal.

In some embodiments, based on the currently set deviation correction value or deviation correction gear, the DCA circuit can adjust the duty cycle of the first initial read/write clock signal to generate the first read/write clock signal and/or adjust the duty cycle of the second initial read/write clock signal to generate the second read/write clock signal.

S304: Receive written data at a specified storage address based on the first read/write clock signal.

S305: Receive read data from the specified storage address based on the second read/write clock signal.

S306: Generate a test result of the DCA circuit based on the written data and the read data.

It can be understood that if the DCA circuit is in a valid state, a duty cycle of the first read/write clock signal and a duty cycle of the second read/write clock signal can be adjusted to 50%. In this case, the written data received by the test platform at the specified storage address based on the first read/write clock signal is consistent with the read data received from the specified storage address based on the second read/write clock signal.

If the DCA circuit is in an invalid state, the duty cycle of the first read/write clock signal and/or the duty cycle of the second read/write clock signal cannot be adjusted to 50%. In this case, the duty cycle of the first initial read/write clock signal and/or the duty cycle of the second initial read/write clock signal have/has a deviation. Therefore, the written data received by the test platform at the specified storage address based on the first read/write clock signal is different from the read data received from the specified storage address based on the second read/write clock signal.

The invalid state includes several situations in which no deviation correction operation is performed, deviation correction is insufficient, deviation correction is excessive, a deviation correction direction is wrong, and the like.

Therefore, in some embodiments, the test platform can compare the written data and the read data to determine whether the DCA circuit is in the valid state, and then generate the test result of the DCA circuit based on a determining result.

In a feasible implementation, when the written data is the same as the read data, it is determined that the DCA circuit is in the valid state; when the written data is different from the read data, it is determined that the DCA circuit is in the invalid state.

According to the method for testing an adjustment circuit in this embodiment of the present disclosure, the test platform provides an initial read/write clock signal with a duty cycle deviation, and adjusts the deviation correction value of the DCA circuit based on the duty cycle deviation of the initial read/write clock signal. After the initial read/write clock signal is adjusted by the DCA circuit, write and read operations are performed at a specified storage address based on an adjusted read/write clock signal, and then whether the DCA circuit is valid can be accurately determined based on written data and read data.

Based on the content described in the above embodiment, in some embodiments, when performing a write operation, the test platform can adjust start time of the first read/write clock signal, such that a time interval between time when an edge of the first read/write clock signal appears and time when an edge of a write command corresponding to the written data appears is equal to a preset time interval. In this way, an actual sampling point is located at a start position of data.

Optionally, the preset time interval is tWCK2DQI.

In some embodiments, the test platform can provide a third read/write clock signal and a fourth read/write clock signal, and a duty cycle of the third read/write clock signal and a duty cycle of the fourth read/write clock signal are the standard duty cycle (50%).

The test platform receives the written data at the specified storage address based on the third read/write clock signal, and receives first read data from the specified storage address based on the fourth read/write clock signal. In a data read and write process, the deviation correction value of the DCA circuit is zero, or the DCA circuit is not set.

Figure 4:
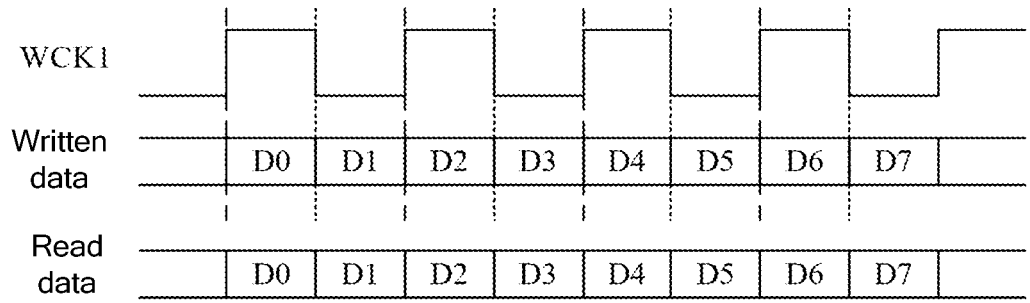
FIG. 4 is a first schematic diagram of a data read/write process according to an embodiment of the present disclosure.

For example, referring to FIG. 4, FIG. 4 is a first schematic diagram of a data read/write process according to an embodiment of the present disclosure.

In FIG. 4, the duty cycle of the fourth read/write clock signal WCK1 is 50%. It is preset that the written data is D0D1D2D3D4D5D6D7. In this case, the first read data received from the specified storage address based on the fourth read/write clock signal should theoretically be D0D1D2D3D4D5D6D7.

The first read data should theoretically be data read based on rising and falling edges of the fourth read/write clock signal WCK1.

In some embodiments, the test platform can provide a fifth read/write clock signal and a sixth read/write clock signal, and a duty cycle of the fifth read/write clock signal and/or a duty cycle of the sixth read/write clock signal have/has the first deviation.

The test platform receives the written data at the specified storage address based on the fifth read/write clock signal, and receives second read data from the specified storage address based on the sixth read/write clock signal. In a data read and write process, the deviation correction value of the DCA circuit is zero, or the DCA circuit is not set.

Figure 5:
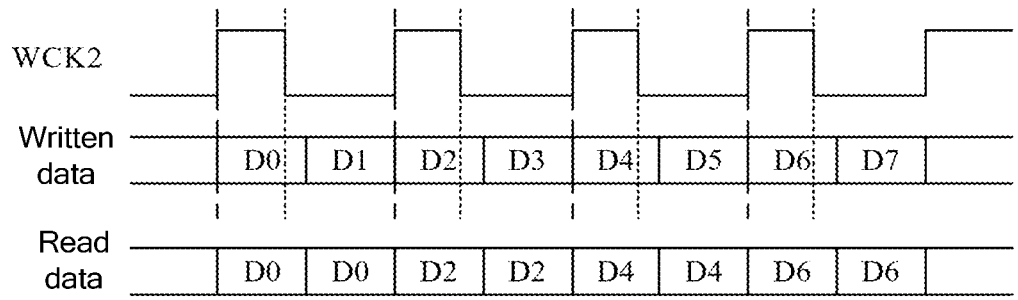
FIG. 5 is a second schematic diagram of a data read/write process according to an embodiment of the present disclosure.

For example, referring to FIG. 5, FIG. 5 is a second schematic diagram of a data read/write process according to an embodiment of the present disclosure.

In FIG. 5, the duty cycle of the sixth read/write clock signal WCK2 deviates to the left by N picoseconds compared with the standard duty cycle (50%). It is preset that the written data is D0D1D2D3D4D5D6D7. In this case, the second read data received from the specified storage address based on the sixth read/write clock signal should theoretically be D0D0D2D2D4D4D6D6.

It can be understood that the data read/write process shown in FIG. 4 is a theoretical data read/write process of the to-be-tested chip when the standard duty cycle is adopted for the read/write clock signal and the DCA circuit is not set; and the data read/write process shown in FIG. 5 is a theoretical data read/write process of the to-be-tested chip when the read/write clock signal has a duty cycle deviation and the DCA circuit is not set.

In this embodiment of the present disclosure, on a premise of using the same written data (D0D1D2D3D4D5D6D7), the data read/write process of the to-be-tested chip when the read/write clock signal has the duty cycle deviation and the DCA circuit is set is tested, and then is compared with the data read/write processes shown in FIG. 4 and FIG. 5 to determine whether the DCA circuit is valid.

Specifically, when the read data is the same as the first read data, it is determined that the DCA circuit is in the valid state; when the read data is the same as the second read data, it is determined that the DCA circuit is in the invalid state.

The invalid state includes situations in which no deviation correction operation is performed, the deviation correction is insufficient, the deviation correction is excessive, and the deviation correction direction is wrong.

Figure 6:
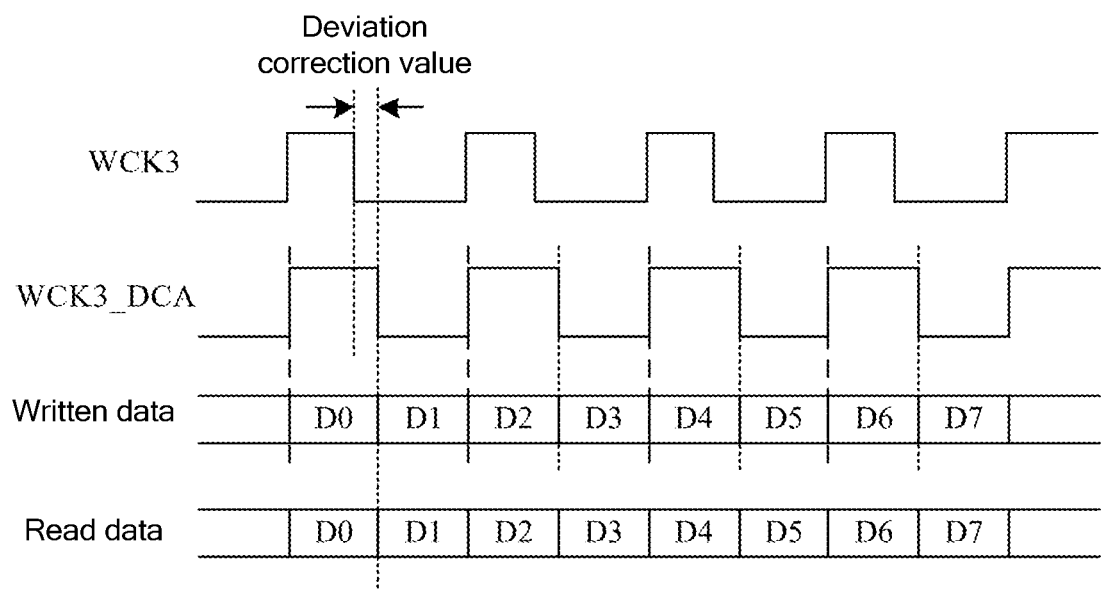
FIG. 6 is a third schematic diagram of a data read/write process according to an embodiment of the present disclosure.

For example, referring to FIG. 6, FIG. 6 is a third schematic diagram of a data read/write process according to an embodiment of the present disclosure.

In FIG. 6, it is preset that the written data is D0D1D2D3D4D5D6D7, and the duty cycle of the second initial read/write clock signal WCK3 deviates to the left by N picoseconds compared with the standard duty cycle (50%). After the DCA circuit adjusts the second initial read/write clock signal WCK3, an adjusted second read/write clock signal WCK3_DCA is generated. The test platform receives the read data from the specified storage address based on the adjusted second read/write clock signal WCK3_DCA. If the read data is D0D1D2D3D4D5D6D7, it is determined that the DCA circuit is in the valid state. If the read data is D0D0D2D2D4D4D6D6, it is determined that the DCA circuit is in the invalid state.

It can be understood that when no deviation correction operation is performed, the deviation correction is insufficient or the deviation correction direction is wrong, a duty cycle of the second read/write clock signal WCK3_DCA has a leftward deviation. Therefore, the read stored data is D0D0D2D2D4D4D6D6.

In some embodiments, the invalid state further includes excessive deviation correction.

Figure 7:
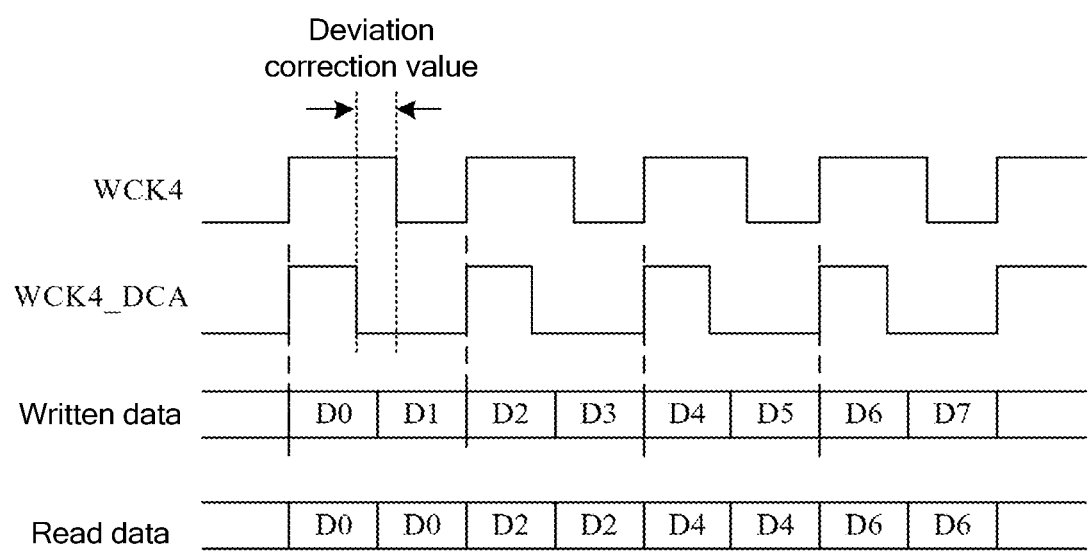
FIG. 7 is a fourth schematic diagram of a data read/write process according to an embodiment of the present disclosure.

Referring to FIG. 7, FIG. 7 is a fourth schematic diagram of a data read/write process according to an embodiment of the present disclosure.

In FIG. 7, it is preset that the written data is D0D1D2D3D4D5D6D7, the duty cycle of the second initial read/write clock signal WCK4 deviates to the right by N picoseconds compared with the standard duty cycle (50%), and the deviation correction value of the DCA circuit is a leftward deviation of N+2 picoseconds. After the DCA circuit adjusts the second initial read/write clock signal WCK4, an adjusted second read/write clock signal WCK4_DCA is generated. The test platform receives the read data from the specified storage address based on the adjusted second read/write clock signal WCK4_DCA. If the read data is D0D1D2D3D4D5D6D7, it is determined that the DCA circuit is in the valid state. If the read stored data is D0D0D2D2D4D4D6D6, it is determined that the DCA circuit is in the invalid state, and the invalid state is caused by excessive deviation correction performed by the DCA circuit.

Figure 8:
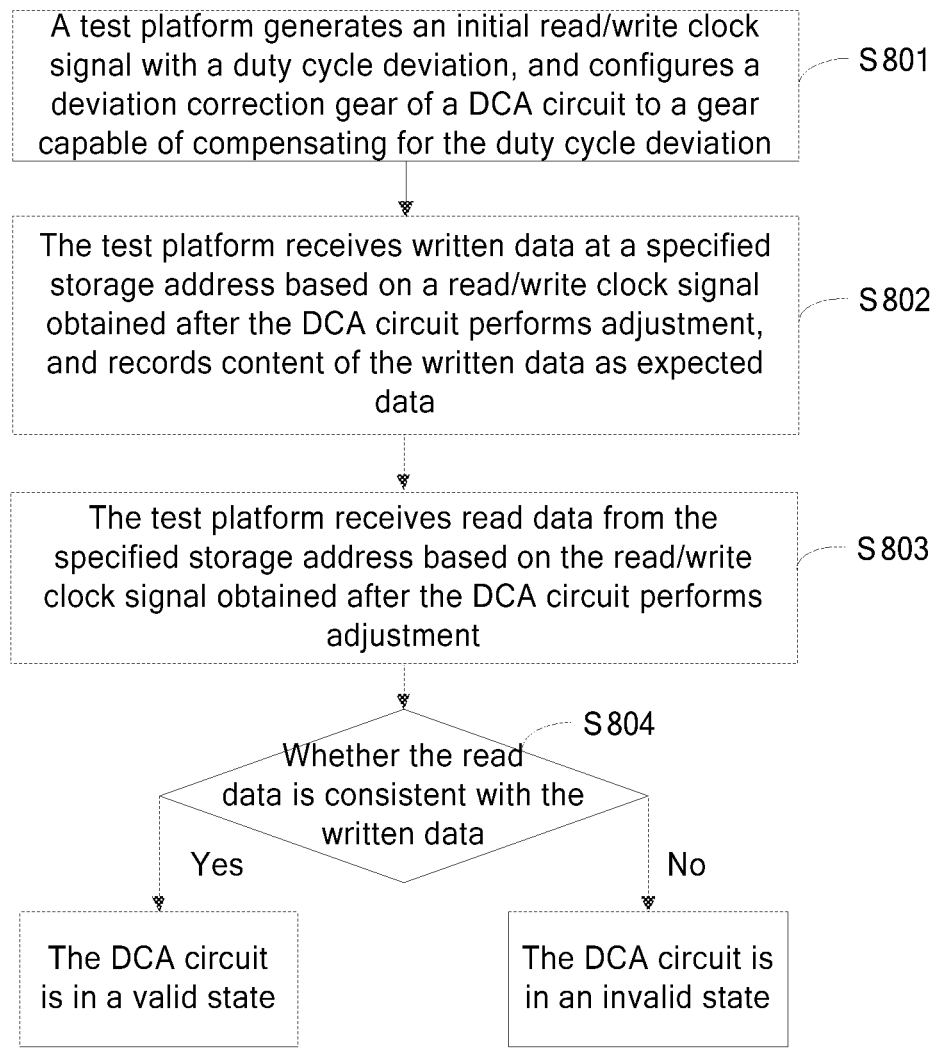
FIG. 8 is a schematic flowchart of steps of still another method for testing an adjustment circuit according to an embodiment of the present disclosure.

For better understanding of the embodiments of the present disclosure, referring to FIG. 8, FIG. 8 is a schematic flowchart of steps of still another method for testing an adjustment circuit according to an embodiment of the present disclosure.

In some embodiments, the method for testing an adjustment circuit includes the following steps:

S801: A test platform generates an initial read/write clock signal with a duty cycle deviation, and configures a deviation correction gear of a DCA circuit to a gear capable of compensating for the duty cycle deviation.

S802: The test platform receives written data at a specified storage address based on a read/write clock signal obtained after the DCA circuit performs adjustment, and records content of the written data as expected data.

S803: The test platform receives read data from the specified storage address based on the read/write clock signal obtained after the DCA circuit performs adjustment.

S804: Compare whether the read data is consistent with the written data. If the read data is consistent with the written data, it is determined that the DCA circuit is in a valid state; if the read data is inconsistent with the written data, it is determined that the DCA circuit is in an invalid state.

It can be understood that configuration of only the DCA circuit is not conducive to verification of a single function. Therefore, an input clock with a duty cycle deviation is made based on a configuration of the DCA circuit, to enable the DCA circuit to correct the duty cycle deviation, and a function of the DCA circuit is finally verified by comparing whether the read data meets an expectation, which will be more accurate.

According to the method for testing an adjustment circuit in this embodiment of the present disclosure, the test platform provides a clock input signal with a duty cycle deviation, and configures the deviation correction gear of the DCA circuit to the gear capable of compensating for the duty cycle deviation. The test platform writes data into a specified address, reads data stored in the specified address, and compares the written data with the read data, to accurately determine whether the DCA circuit is valid.

Figure 9:
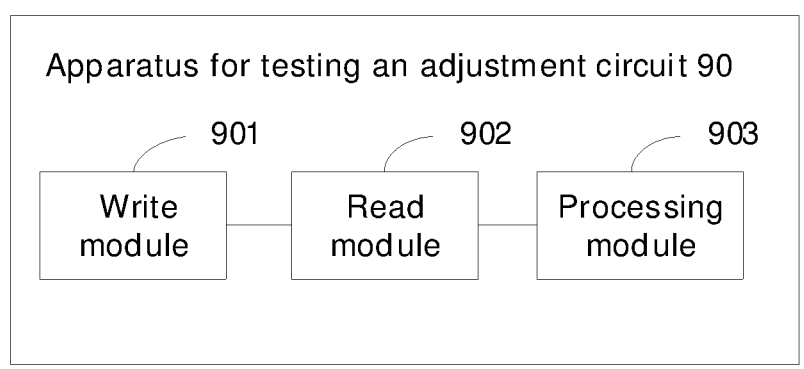
FIG. 9 is a schematic diagram of program modules of an apparatus for testing an adjustment circuit according to an embodiment of the present disclosure.

The embodiments of the present disclosure further provide an apparatus for testing an adjustment circuit. Referring to FIG. 9, FIG. 9 is a schematic diagram of program modules of an apparatus for testing an adjustment circuit according to an embodiment of the present disclosure. The apparatus for testing an adjustment circuit is applied to a test platform, the adjustment circuit includes a DCA circuit, the test platform is electrically connected to the adjustment circuit, and the apparatus 90 for testing an adjustment circuit includes:

a write module 901, configured to receive written data at a specified storage address based on a first read/write clock signal;

a read module 902, configured to receive read data from the specified storage address based on a second read/write clock signal; and a processing module 903, configured to generate a test result of the DCA circuit based on the written data and the read data.

The DCA circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

According to the apparatus for testing an adjustment circuit in this embodiment of the present disclosure, the test platform provides an initial read/write clock signal with a duty cycle deviation. After the initial read/write clock signal is adjusted by the DCA circuit, write and read operations are performed at a specified storage address based on an adjusted read/write clock signal, and then whether the DCA circuit is valid can be accurately determined based on written data and read data.

In some embodiments, the apparatus for testing an adjustment circuit further includes an adjustment module, configured to:

adjust a deviation correction value of the DCA circuit to a first deviation correction value based on the first deviation and a preset corresponding relationship between a duty cycle deviation and a deviation correction value.

In some embodiments, the processing module 903 is configured to: compare the written data with the read data; and when the written data is the same as the read data, determine that the DCA circuit is in a valid state; or when the written data is different from the read data, determine that the DCA circuit is in an invalid state.

In some embodiments, the adjustment module is further configured to: adjust start time of the first read/write clock signal, such that a time interval between time when an edge of the first read/write clock signal appears and time when an edge of a write command corresponding to the written data appears is equal to a preset time interval.

In some embodiments, the write module 901 is further configured to receive the written data at the specified storage address based on a third read/write clock signal.

The read module 902 is further configured to receive first read data from the specified storage address based on a fourth read/write clock signal.

A duty cycle of the third read/write clock signal and a duty cycle of the fourth read/write clock signal are standard duty cycles, and a deviation correction value of the DCA circuit is zero.

In some embodiments, the write module 901 is further configured to receive the written data at the specified storage address based on a fifth read/write clock signal.

The read module 902 is further configured to receive second read data from the specified storage address based on a sixth read/write clock signal.

A duty cycle of the fifth read/write clock signal and/or a duty cycle of the sixth read/write clock signal have/has the first deviation, and the deviation correction value of the DCA circuit is zero.

In some embodiments, the processing module 903 is configured to: when the read data is the same as the first read data, determine that the DCA circuit is in the valid state; or when the read data is the same as the second read data, determine that the DCA circuit is in the invalid state.

It should be noted that, for content specifically executed by the write module 901, the read module 902, and the processing module 903 in this embodiment of the present disclosure, reference may be made to the related content in the embodiments shown in FIG. 1 to FIG. 8, and details are not described herein again.

Further, based on the content described in the foregoing embodiments, the embodiments of the present application further provide an apparatus for testing an adjustment circuit. The apparatus includes at least one processor and a memory. The memory stores a computer executable instruction; and the at least one processor executes the computer executable instruction stored in the memory, to implement the steps in the method for testing an adjustment circuit described in the foregoing embodiments, and details are not described herein again.

Figure 10:
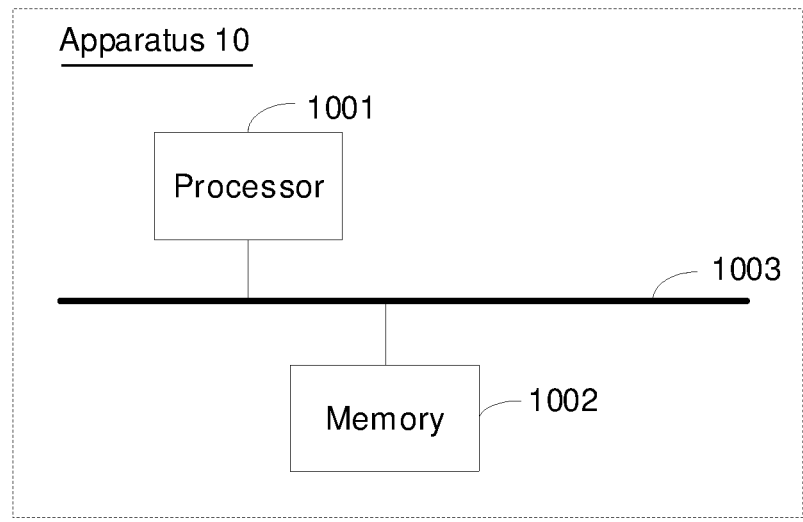
FIG. 10 is a schematic diagram of a hardware structure of an apparatus for testing an adjustment circuit according to an embodiment of the present disclosure.

For better understanding of the embodiments of the present disclosure, referring to FIG. 10, FIG. 10 is a schematic diagram of a hardware structure of an apparatus for testing an adjustment circuit according to an embodiment of the present disclosure.

As shown in FIG. 10, the apparatus 10 in this embodiment includes a processor 1001 and a memory 1002, where:

the memory 1002 is configured to store a computer executable instruction; and the processor 1001 is configured to execute the computer executable instruction stored in the memory, to implement the steps in the method for testing an adjustment circuit described in the foregoing embodiments. For details, reference may be made to the related description in the foregoing method embodiments.

Optionally, the memory 1002 may be independent or integrated with the processor 1001.

When the memory 1002 is independent, the apparatus 10 further includes a bus 1003, configured to connect the memory 1002 and the processor 1001.

Further, based on the content described in the foregoing embodiments, the embodiments of the present application further provide a computer-readable storage medium. The computer-readable storage medium stores a computer executable instruction. When executing the computer executable instruction, a processor implements the steps in the method for testing an adjustment circuit described in the foregoing embodiments. For details, reference may be made to the related description in the foregoing method embodiments.

In several embodiments provided in the present disclosure, it should be understood that the disclosed device and method may be implemented in other manners. For example, the described device embodiment is merely an example. For example, the module division is merely a logical function division, and there may be other division manners in actual implementation.

For example, a plurality of modules may be combined or integrated into another system, or some features may be ignored or may not be performed. In addition, the displayed or discussed mutual couplings or direct couplings or communication connections may be implemented by using some interfaces. The indirect couplings or communication connections between the apparatuses or modules may be implemented in electric, mechanical, or other forms.

The modules described as separate parts may or may not be physically separate, and parts displayed as modules may or may not be physical units, may be located in one position, or may be distributed on a plurality of network elements. Some or all of the modules may be selected based on actual needs to achieve the objectives of the solutions of the embodiments.

In addition, functional modules in the embodiments of the present disclosure may be integrated into one processing unit, or each of the modules may exist alone physically, or two or more modules are integrated into one unit. The unit consisting of integrated modules may be implemented in a form of hardware, or may be implemented in a form of hardware plus software functional units.

The integrated module implemented in a form of a software functional module may be stored in a computer-readable storage medium. The software functional module is stored in a storage medium and includes instructions to enable a computer device (which may be a personal computer, a server, a network device, or the like) or a processor to perform some of the steps of the methods described in the embodiments of the present disclosure.

It should be understood that the processor may be a central processing unit (CPU), or may be a general-purpose processor, a digital signal processor (DSP), an application-specific integrated circuit (ASIC), or the like. The general-purpose processor may be a microprocessor, or the processor may also be any conventional processor. The steps of each method disclosed in the present disclosure can be directly performed by a hardware processor, or by a combination of hardware in a processor and a software module.

The memory may include a high-speed random access memory (RAM), or may further include a non-volatile memory (NVM), for example, at least one magnetic disk memory, or may further be a USB flash disk, a mobile hard disk, a read-only memory (ROM), a magnetic disk or an optical disc.

The bus may be an industry standard architecture (ISA) bus, a peripheral component interconnect (PCI) bus, an extended industry standard architecture (EISA) bus, or the like. The bus may be classified into an address bus, a data bus, a control bus, and the like. For ease of representation, the bus in the accompanying drawings of the present disclosure is not limited to only one bus or only one type of bus.

The storage medium may be implemented by any type of volatile or non-volatile storage device or a combination thereof, such as a static RAM (SRAM), an electrically erasable programmable ROM (EEPROM), an erasable programmable ROM (EPROM), a programmable ROM (PROM), a ROM, a magnetic memory, a flash memory, a magnetic disk or an optical disc. The storage medium may be any usable medium accessible by a general-purpose computer or a special-purpose computer.

For example, the storage medium is coupled to a processor, such that the processor can read information from the storage medium or write information into the storage medium. Certainly, the storage medium may alternatively be a component of the processor. The processor and the storage medium may be located in an ASIC. Certainly, the processor and the storage medium may also be located in an electronic device or a main control device as discrete components.

Those of ordinary skill in the art can understand that all or some of the steps in the foregoing method embodiments may be implemented by a program instructing relevant hardware. The program may be stored in a computer-readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A method for testing an adjustment circuit, applied to a test platform, wherein the adjustment circuit comprises a duty cycle adjuster circuit, the test platform is electrically connected to the adjustment circuit, and the method comprises:
   receiving written data at a specified storage address based on a first read/write clock signal; and
   receiving read data from the specified storage address based on a second read/write clock signal, and generating a test result of the duty cycle adjuster circuit based on the written data and the read data; wherein
   the duty cycle adjuster circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

2. The method according to claim 1, further comprising:
   adjusting a deviation correction value of the duty cycle adjuster circuit to a first deviation correction value based on the first deviation and a preset corresponding relationship between a duty cycle deviation and a deviation correction value.

3. The method according to claim 2, wherein the first deviation is N picoseconds deviated to a first direction, and the N is not 0; and
   the adjusting a deviation correction value of the duty cycle adjuster circuit to a first deviation correction value comprises:
   adjusting the deviation correction value of the duty cycle adjuster circuit to the N picoseconds deviated to a second direction, wherein the second direction is opposite to the first direction.

4. The method according to claim 3, wherein the generating a test result of the duty cycle adjuster circuit based on the written data and the read data comprises:
   comparing the written data with the read data; and
   when the written data is the same as the read data, determining that the duty cycle adjuster circuit is in a valid state; or
   when the written data is different from the read data, determining that the duty cycle adjuster circuit is in an invalid state.

5. The method according to claim 1, further comprising:
   adjusting a start time of the first read/write clock signal, such that a time interval between a time when an edge of the first read/write clock signal appears and a time when an edge of a write command corresponding to the written data appears is equal to a preset time interval.

6. The method according to claim 1, wherein before the receiving written data at a specified storage address based on a first read/write clock signal, the method further comprises:
   receiving the written data at the specified storage address based on a third read/write clock signal; and
   receiving first read data from the specified storage address based on a fourth read/write clock signal; wherein
   a duty cycle of the third read/write clock signal and a duty cycle of the fourth read/write clock signal are standard duty cycles, and a deviation correction value of the duty cycle adjuster circuit is zero.

7. The method according to claim 6, wherein before the receiving written data at a specified storage address based on a first read/write clock signal, the method further comprises:
   receiving the written data at the specified storage address based on a fifth read/write clock signal; and
   receiving second read data from the specified storage address based on a sixth read/write clock signal; wherein
   a duty cycle of the fifth read/write clock signal and/or a duty cycle of the sixth read/write clock signal have/has the first deviation, and the deviation correction value of the duty cycle adjuster circuit is zero.

8. The method according to claim 7, wherein the generating a test result of the duty cycle adjuster circuit based on the written data and the read data comprises:
   when the read data is the same as the first read data, determining that the duty cycle adjuster circuit is in a valid state; or
   when the read data is the same as the second read data, determining that the duty cycle adjuster circuit is in an invalid state.

9. An apparatus for testing an adjustment circuit, applied to a test platform, wherein the adjustment circuit comprises a duty cycle adjuster circuit, the test platform is electrically connected to the adjustment circuit, and the apparatus comprises: at least one processor and a memory, wherein
   the memory stores a computer executable instruction; and
   the at least one processor executes the computer executable instruction stored in the memory, such that the at least one processor performs:
   receiving written data at a specified storage address based on a first read/write clock signal;
   receiving read data from the specified storage address based on a second read/write clock signal; and
   generating a test result of the duty cycle adjuster circuit based on the written data and the read data; wherein
   the duty cycle adjuster circuit is configured to adjust a first initial read/write clock signal to generate the first read/write clock signal and/or adjust a second initial read/write clock signal to generate the second read/write clock signal, and a duty cycle of the first initial read/write clock signal and/or a duty cycle of the second initial read/write clock signal have/has a first deviation.

10. The apparatus according to claim 9, wherein the at least one processor performs:
    adjusting a deviation correction value of the duty cycle adjuster circuit to a first deviation correction value based on the first deviation and a preset corresponding relationship between a duty cycle deviation and a deviation correction value.

11. The apparatus according to claim 10, wherein the first deviation is N picoseconds deviated to a first direction, and the N is not 0; and
    the at least one processor performs:
    adjusting the deviation correction value of the duty cycle adjuster circuit to the N picoseconds deviated to a second direction, wherein the second direction is opposite to the first direction.

12. The apparatus according to claim 11, wherein the at least one processor performs:
    comparing the written data with the read data; and
    when the written data is the same as the read data, determining that the duty cycle adjuster circuit is in a valid state; or
    when the written data is different from the read data, determining that the duty cycle adjuster circuit is in an invalid state.

13. The apparatus according to claim 10, wherein the at least one processor performs:
adjusting a start time of the first read/write clock signal, such that a time interval between a time when an edge of the first read/write clock signal appears and a time when an edge of a write command corresponding to the written data appears is equal to a preset time interval.

14. The apparatus according to claim 9, wherein the at least one processor performs:
receiving the written data at the specified storage address based on a third read/write clock signal; and
receiving first read data from the specified storage address based on a fourth read/write clock signal; wherein
a duty cycle of the third read/write clock signal and a duty cycle of the fourth read/write clock signal are standard duty cycles, and a deviation correction value of the duty cycle adjuster circuit is zero.

15. The apparatus according to claim 14, wherein the at least one processor performs:
receiving the written data at the specified storage address based on a fifth read/write clock signal; and
receiving second read data from the specified storage address based on a sixth read/write clock signal; wherein
a duty cycle of the fifth read/write clock signal and/or a duty cycle of the sixth read/write clock signal have/has the first deviation, and the deviation correction value of the duty cycle adjuster circuit is zero.

16. The apparatus according to claim 15, wherein the at least one processor performs:
when the read data is the same as the first read data, determining that the duty cycle adjuster circuit is in a valid state; or
when the read data is the same as the second read data, determining that the duty cycle adjuster circuit is in an invalid state.

17. A computer-readable storage medium, storing a computer executable instruction therein, when executing the computer executable instruction, a processor implements the method for testing an adjustment circuit according to claim 1.

* * * * *